(12) United States Patent
Moon

(10) Patent No.: US 10,347,188 B2
(45) Date of Patent: Jul. 9, 2019

(54) DISPLAY DEVICE HAVING A DRIVING VOLTAGE LINE

(71) Applicant: Samsung Display Co., Ltd, Yongin-si, Gyeonggi-do (KR)

(72) Inventor: Sunghoon Moon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 16 days.

(21) Appl. No.: 15/470,638

(22) Filed: Mar. 27, 2017

(65) Prior Publication Data

US 2017/0358262 A1 Dec. 14, 2017

(30) Foreign Application Priority Data

Jun. 14, 2016 (KR) .................... 10-2016-0073824

(51) Int. Cl.
*G09G 3/3225* (2016.01)
*G09G 3/3266* (2016.01)

(52) U.S. Cl.
CPC ......... *G09G 3/3266* (2013.01); *G09G 3/3225* (2013.01); *G09G 2310/0264* (2013.01)

(58) Field of Classification Search
CPC .................................................. G09G 3/3225
USPC .......................................................... 345/82
See application file for complete search history.

(56) References Cited

U.S. PATENT DOCUMENTS

| | | | |
|---|---|---|---|
| 9,245,908 B2 | 1/2016 | Lee et al. | |
| 2014/0292622 A1* | 10/2014 | Lee .................. | G09G 3/3233 345/80 |
| 2015/0102303 A1 | 4/2015 | Kim | |
| 2015/0364102 A1* | 12/2015 | Oh .................... | G02F 1/136286 345/206 |
| 2016/0172430 A1 | 6/2016 | Park et al. | |
| 2016/0211273 A1 | 7/2016 | Moon | |
| 2017/0330928 A1 | 11/2017 | Choi et al. | |

FOREIGN PATENT DOCUMENTS

| | | |
|---|---|---|
| KR | 10-2004-0026959 A | 4/2004 |
| KR | 10-2014-0104263 A | 8/2014 |
| KR | 10-2015-0019891 A | 2/2015 |
| KR | 10-2015-0043143 A | 4/2015 |
| KR | 10-2017-0129337 A | 11/2017 |

* cited by examiner

*Primary Examiner* — Long D Pham
(74) *Attorney, Agent, or Firm* — Innovation Counsel LLP

(57) ABSTRACT

A display device includes a plurality of pixels, wherein a first pixel of the plurality of pixels includes: a scan line extending in a first direction; a data line extending in a second direction intersecting the first direction; a switching thin film transistor (TFT) connected to the scan line and the data line; a driving TFT connected to the switching TFT and comprising a driving gate electrode; a storage capacitor comprising the driving gate electrode as a first electrode and a second electrode arranged above the first electrode and overlapping the first electrode; a horizontal driving voltage line extending from the second electrode in the first direction; and a vertical driving voltage line extending from the second electrode in the second direction, wherein the horizontal driving voltage line, the vertical driving voltage line, and the data line are arranged over a same layer.

20 Claims, 18 Drawing Sheets

DISPLAY DEVICE HAVING A DRIVING VOLTAGE LINE

CROSS-REFERENCE TO RELATED APPLICATION

This application claims the benefit of Korean Patent Application No. 10-2016-0073824, filed on Jun. 14, 2016, in the Korean Intellectual Property Office, the disclosure of which is incorporated herein in its entirety by reference.

BACKGROUND

1. Field

One or more embodiments relate to a display device.

2. Description of the Related Art

Generally, a display device may include a display element and electronic devices for controlling an electric signal applied to the display element. The electronic devices include a thin film transistor (TFT), a storage capacitor, and a plurality of wirings.

To precisely control whether the display element emits light and the degree of light emission, the number of TFTs electrically connected to one display element has increased, and the number of wirings transferring electric signals to the TFTs has also increased. Accordingly, research into a high integration of a display device has been actively conducted.

SUMMARY

One or more embodiments include a display device that can prevent a voltage drop of a driving voltage and can achieve a high integration.

However, this feature is an example and does not limit the scope of the disclosure.

Additional aspects will be set forth in part in the description which follows and, in part, will be apparent from the description, or may be learned by practice of the presented embodiments.

According to one or more embodiments, a display device includes a plurality of pixels, wherein a first pixel of the plurality of pixels includes: a scan line extending in a first direction; a data line extending in a second direction intersecting the first direction; a switching thin film transistor (TFT) connected to the scan line and the data line; a driving TFT connected to the switching TFT and including a driving gate electrode; a storage capacitor including the driving gate electrode as a first electrode and a second electrode arranged above the first electrode and overlapping the first electrode; a horizontal driving voltage line extending from the second electrode in the first direction; and a vertical driving voltage line extending from the second electrode in the second direction, wherein the horizontal driving voltage line, the vertical driving voltage line, and the data line are arranged over a same layer.

The first pixel of the plurality of pixels may further include a connection line arranged over a different layer from the data line, wherein the data line includes a first data line and a second data line that are spaced apart from each other, and wherein the first data line and the second data line are connected to the connection line through a first contact hole and a second contact hole, respectively.

The horizontal driving voltage line may extend in the first direction by extending through a space between the first data line and the second data line.

The horizontal driving voltage line, the vertical driving voltage line, and the second electrode may be integrally formed together.

The horizontal driving voltage line may be connected to a second electrode of a storage capacitor of a second pixel neighboring the first pixel.

The connection line may be arranged below the data line with at least one insulating layer disposed between the connection line and the data line.

The connection line may be arranged over a same layer as the driving gate electrode.

The first pixel of the plurality of pixels may further include a connection line arranged over a different layer from the horizontal driving voltage line, wherein the horizontal driving voltage line includes a first horizontal driving voltage line and a second horizontal driving voltage line that are spaced apart from each other, and wherein the first horizontal driving voltage line and the second horizontal driving voltage line are connected to the connection line through a contact hole.

The data line may extend in the second direction by extending through a space between the first horizontal driving voltage line and the second horizontal driving voltage line.

The first horizontal driving voltage line may be connected to a second horizontal driving voltage line of a second pixel neighboring the first pixel.

The connection line may be arranged below the horizontal driving voltage line with at least one insulating layer disposed between the connection line and the horizontal driving voltage line.

The connection line may be arranged over a same layer as the driving gate electrode.

The driving TFT of the first pixel may further include a driving semiconductor layer at least partially overlapping the driving gate electrode and having a bent shape, and wherein a shape of the driving TFT of the first pixel is the same as a shape of a driving TFT of a second pixel that moves in parallel in the first direction, the second pixel neighboring the first pixel.

The first pixel may include an organic light emitting diode (OLED) electrically connected to the driving TFT.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
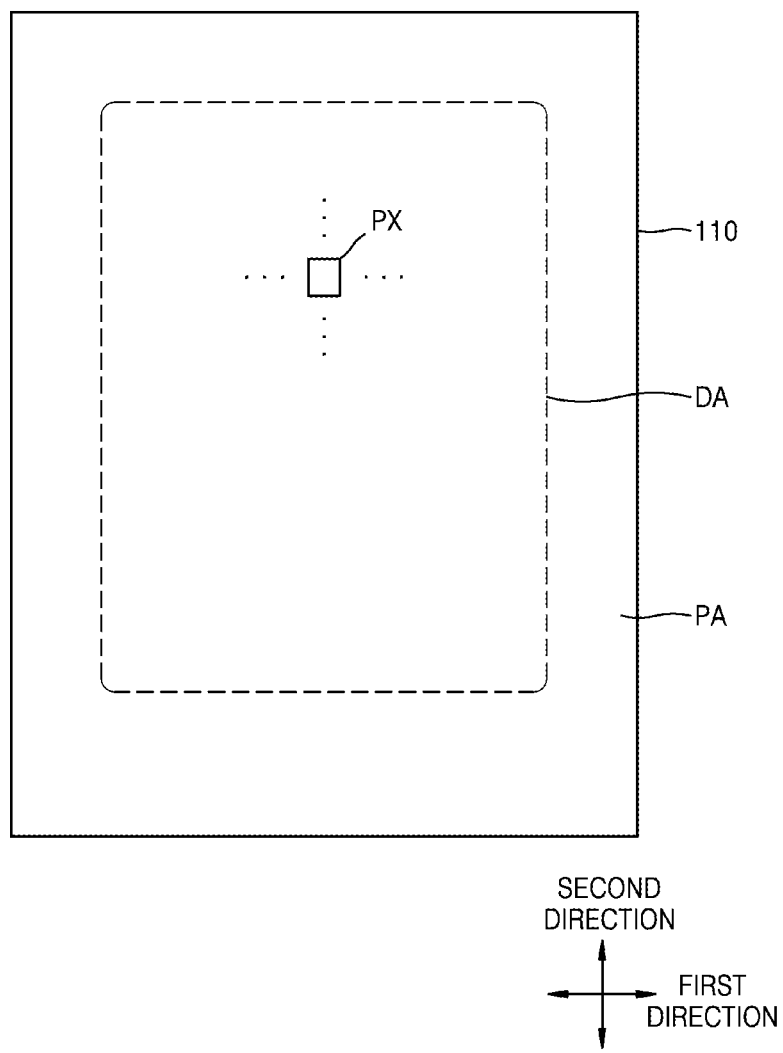
FIG. 1 is a schematic plan view of a display device according to an embodiment.

As disclosure allows for various changes and numerous embodiments, particular embodiments will be illustrated in the drawings and described in the written description. The effect and feature of the disclosure and the method of realizing the effect and feature will be clear with reference to the embodiments described below with reference to the drawings. However, the disclosure may be embodied in various forms and should not be construed as being limited to the embodiments. As used herein, the term "and/or" may include any and all combinations of one or more of the associated listed items.

Hereinafter, the embodiments will be described with reference to the drawings. Like reference numerals refer to like elements in the drawings, and thus, descriptions of similar or identical elements will not be repeated.

It will be understood that although the terms "first", "second", etc. may be used herein to describe various components, these components should not be limited by these terms. These components are only used to distinguish one component from another.

As used herein, the singular forms "a" "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

When films, regions, or components are connected to each other, the films, the regions, or the components may not only be directly connected to each other, but may also be indirectly connected to each other as another film, another region, or another component is disposed therebetween. For example, when films, regions, or components are electrically connected to each other, the films, the regions, or the components may not only be directly electrically connected to each other, but may also be indirectly electrically connected to each other as another film, another region, or another component is disposed therebetween.

FIG. 1 is a schematic plan view of a display device according to an embodiment.

Pixels PX including various display elements such as an organic light-emitting diode OLED may be arranged in a display area DA of a substrate 110. Various wirings transferring electric signals to be applied to the display area DA may be arranged in a peripheral area PA of the substrate 110. For convenience of description, a display device including the organic light-emitting diode OLED as the display element will be described below. However, the embodiments are not limited thereto. Various types of a display device such as a liquid crystal display device, an electrophoretic display device, an inorganic light-emitting display device, etc. may be applied.

Figure 2:
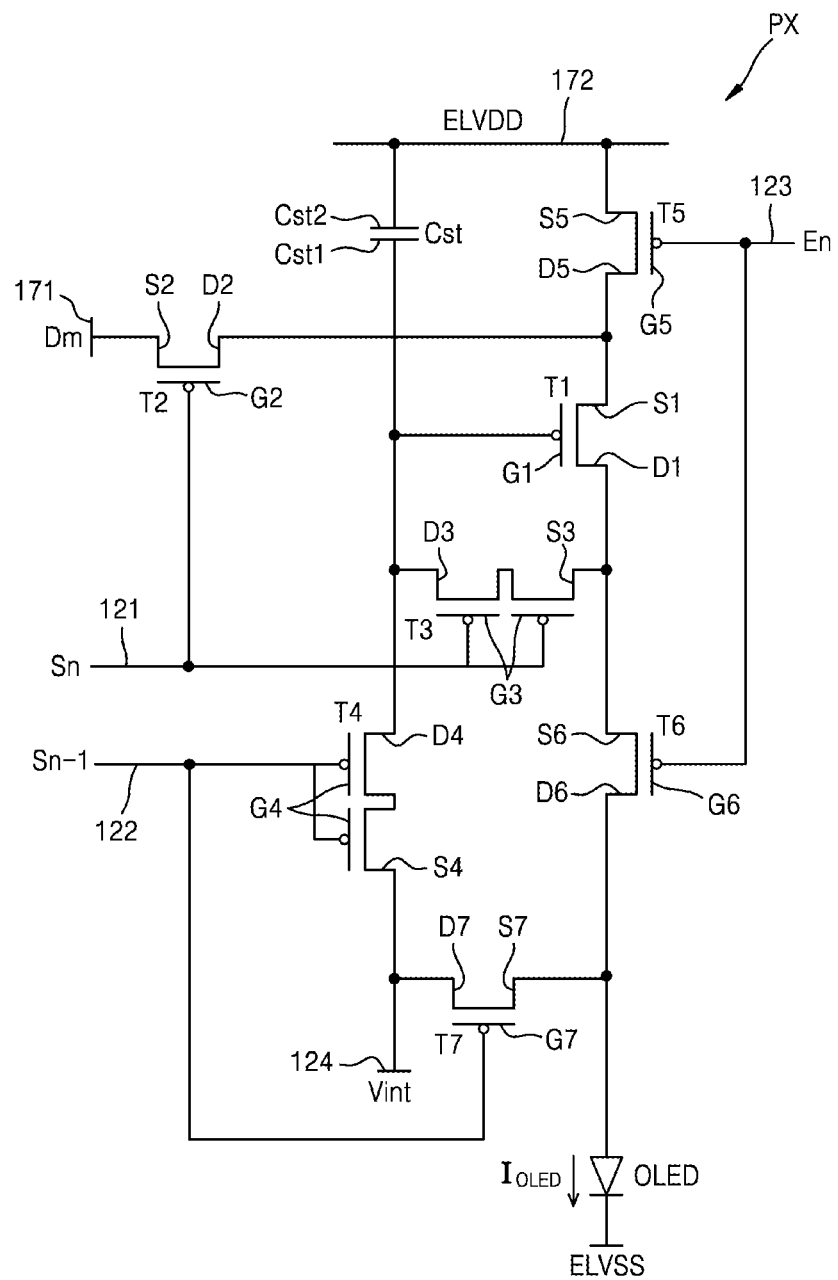
FIG. 2 is an equivalent circuit view of one pixel included in the display device of FIG. 1.

FIG. 2 is an equivalent circuit view of one pixel PX included in the display device of FIG. 1.

Referring to FIG. 2, the pixel PX may include signal lines 121, 122, 123, and 171, a plurality of thin film transistors (TFTs) T1, T2, T3, T4, T5, T6, and T7 connected to the signal lines 121, 122, 123, and 171, a storage capacitor Cst, an initialization voltage line 124, a driving voltage line 172, and an organic light-emitting diode OLED.

FIG. 2 illustrates that each pixel PX may include the signal lines 121, 122, 123, and 171, the initialization voltage line 124, and the driving voltage line 172, but the embodiments are not limited thereto. As another embodiment, neighboring pixels may share at least one of the signal lines 121, 122, 123, and 171 and/or the initialization voltage line 124.

The TFTs T1, T2, T3, T4, T5, T6, and T7 may include a driving TFT T1, a switching TFT T2, a compensation TFT T3, a first initialization TFT T4, an operation control TFT T5, an emission control TFT T6, and a second initialization TFT T7.

The signal lines 121, 122, 123, and 171 may include a scan line 121 transferring a scan signal Sn, a previous scan line 122 transferring a previous scan signal Sn−1 to the first initialization TFT T4 and the second initialization TFT T7, an emission control line 123 transferring an emission control signal En to the operation control TFT T5 and the emission control TFT T6, and a data line 171 crossing the scan line 121 and transferring a data signal Dm. The driving voltage line 172 may transfer a driving voltage ELVDD to the driving TFT T1. The initialization voltage line 124 may transfer an initialization voltage Vint initializing the driving TFT T1 and the pixel electrode.

A driving gate electrode G1 of the driving TFT T1 may be connected to a first storage plate Cst1 of the storage capacitor Cst. A driving source electrode S1 of the driving TFT T1 may be connected to the driving voltage line 172 through the operation control TFT T5. A driving drain electrode D1 of the driving TFT T1 may be electrically connected to a pixel electrode of the organic light-emitting diode OLED through the emission control TFT T6. The driving TFT T1 may receive the data signal Dm in response to a switching operation of the switching TFT T2 and may supply a driving current $I_{OLED}$ to the organic light-emitting diode OLED.

A switching gate electrode G2 of the switching TFT T2 may be connected to the scan line 121. A switching source electrode S2 of the switching TFT T2 may be connected to the data line 171. A switching drain electrode D2 of the switching TFT T2 may be connected to the driving source electrode S1 of the driving TFT T1 and connected to the driving voltage line 172 through the operation control TFT T5. The switching TFT T2 may be turned on in response to the scan signal Sn transferred through the scan line 121 and may perform a switching operation of transferring the data signal Dm transferred through the data line 171 to the driving source electrode S1 of the driving TFT T1.

A compensation gate electrode G3 of the compensation TFT T3 may be connected to the scan line 121. A compensation source electrode S3 of the compensation TFT T3 may be connected to the driving drain electrode D1 of the driving TFT T1 and connected to the pixel electrode of the organic light-emitting diode OLED through the emission control TFT T6. A compensation drain electrode D3 of the compensation TFT T3 may be connected to the first storage plate Cst1 of the storage capacitor Cst, a first initialization drain electrode D4 of the first initialization TFT T4, and the driving gate electrode G1 of the driving TFT T1. The compensation TFT T3 may be turned on in response to the scan signal Sn transferred through the scan line 121 and may diode-connect the driving TFT T1 by electrically connecting the driving gate electrode G1 and the driving drain electrode D1 of the driving TFT T1.

A first initialization gate electrode G4 of the first initialization TFT T4 may be connected to the previous scan line 122. A first initialization source electrode S4 of the first initialization TFT T4 may be connected to a second initialization drain electrode D7 of the second initialization TFT T7 and the initialization voltage line 124. The first initialization drain electrode D4 of the first initialization TFT T4 may be connected to the first storage plate Cst1 of the storage capacitor Cst, the compensation drain electrode D3 of the compensation TFT T3, and the driving gate electrode G1 of the driving TFT T1. The first initialization TFT T4 may be turned on in response to the previous scan signal Sn−1 transferred through the previous scan line 122 and may perform an initialization operation of initializing a voltage of the driving gate electrode G1 of the driving TFT T1 by transferring the initialization voltage Vint to the driving gate electrode G1 of the driving TFT T1.

An operation control gate electrode G5 of the operation control TFT T5 may be connected to the emission control line 123. An operation control source electrode S5 of the operation control TFT T5 may be connected to the driving voltage line 172. An operation control drain electrode D5 of the operation control TFT T5 may be connected to the driving source electrode S1 of the driving TFT T1 and the switching drain electrode D2 of the switching TFT T2.

An emission control gate electrode G6 of the emission control TFT T6 may be connected to the emission control line 123. An emission control source electrode S6 of the emission control TFT T6 may be connected to the driving drain electrode D1 of the driving TFT T1 and the compensation source electrode S3 of the compensation TFT T3. An emission control drain electrode D6 of the emission control TFT T6 may be electrically connected to the second initialization source electrode S7 of the second initialization TFT T7 and the pixel electrode of the organic light-emitting diode OLED.

The operation control TFT T5 and the emission control TFT T6 may be simultaneously turned on in response to an emission control signal En transferred through the emission control line 123 and may allow the driving voltage ELVDD to be applied to the organic light-emitting diode OLED and the driving current $I_{OLED}$ to flow through the organic light-emitting diode OLED.

A second initialization gate electrode G7 of the second initialization TFT T7 may be connected to the previous scan line 122. A second initialization source electrode S7 of the second initialization TFT T7 may be connected to the emission control drain electrode D6 of the emission control TFT T6 and the pixel electrode of the organic light-emitting diode OLED. The second initialization drain electrode D7 of the second initialization TFT T7 may be connected to the first initialization source electrode S4 of the first initialization TFT T4 and the initialization voltage line 124. The second initialization TFT T7 may be turned on in response to the previous scan signal Sn−1 transferred through the previous scan line 122 and may initialize the pixel electrode of the organic light-emitting diode OLED.

FIG. 2 illustrates that the first initialization TFT T4 and the second initialization TFT T7 are connected to the previous scan line 122, but the embodiments are not limited thereto. As another embodiment, the first initialization TFT T4 may be connected to the previous scan line 122 and driven in response to the previous scan signal Sn−1, and the second initialization TFT T7 may be connected to a separate signal line (for example, a subsequent scan line) and driven in response to a signal transferred through the separate signal line.

A second storage plate Cst2 of the storage capacitor Cst may be connected to the driving voltage line 172. An opposite electrode of the organic light-emitting diode OLED may be connected to a common voltage ELVSS. Accordingly, the organic light-emitting diode OLED may receive the driving current $I_{OLED}$ from the driving TFT T1 and emit light, thereby displaying an image.

FIG. 2 illustrates that the compensation TFT T3 and the initialization TFT T4 include a dual gate electrode, but the embodiments are not limited thereto. For example, the compensation TFT T3 and the initialization TFT T4 may include one gate electrode. At least one of the TFTs T1, T2, T5, T6, T7, in addition to the compensation TFT T3 and the initialization TFT T4, may have the dual gate electrode, and various modifications may be made.

An operation of each of the pixels PX according to an embodiment is described below.

During an initialization period, if the previous scan signal Sn−1 is supplied through the previous scan line 122, the initialization TFT T4 may be turned on in response to the previous scan signal Sn−1, and the driving TFT T1 may be initialized by the initialization voltage Vint supplied from the initialization voltage line 124.

During a data programming period, if the scan signal Sn is supplied through the scan line 121, the switching TFT T2 and the compensation TFT T3 may be turned on in response to the scan signal Sn. In this regard, the driving TFT T1 may be diode-connected and forward-biased by the compensation TFT T3 that is turned on.

Then, a compensation voltage Dm+Vth (Vth is a (−) value) reduced by a threshold voltage Vth of the driving TFT T1 from the data signal Dm supplied from the data line 171 may be applied to the driving gate electrode G1 of the driving TFT T1.

The driving voltage ELVDD and the compensation voltage Dm+Vth may be applied to both ends of the storage capacitor Cst. Charges corresponding to a voltage difference between both ends may be stored in the storage capacitor Cst.

During an emission period, the operation control TFT T5 and the emission control TFT T6 may be turned on in response to the emission control signal En supplied from the emission control line 123. The driving current $I_{OLED}$ that corresponds to a voltage difference between a voltage of the gate electrode G1 of the driving TFT T1 and the driving voltage ELVDD may be generated. The driving current $I_{OLED}$ may be supplied to the organic light-emitting diode OLED through the emission control TFT T6.

Figure 3:
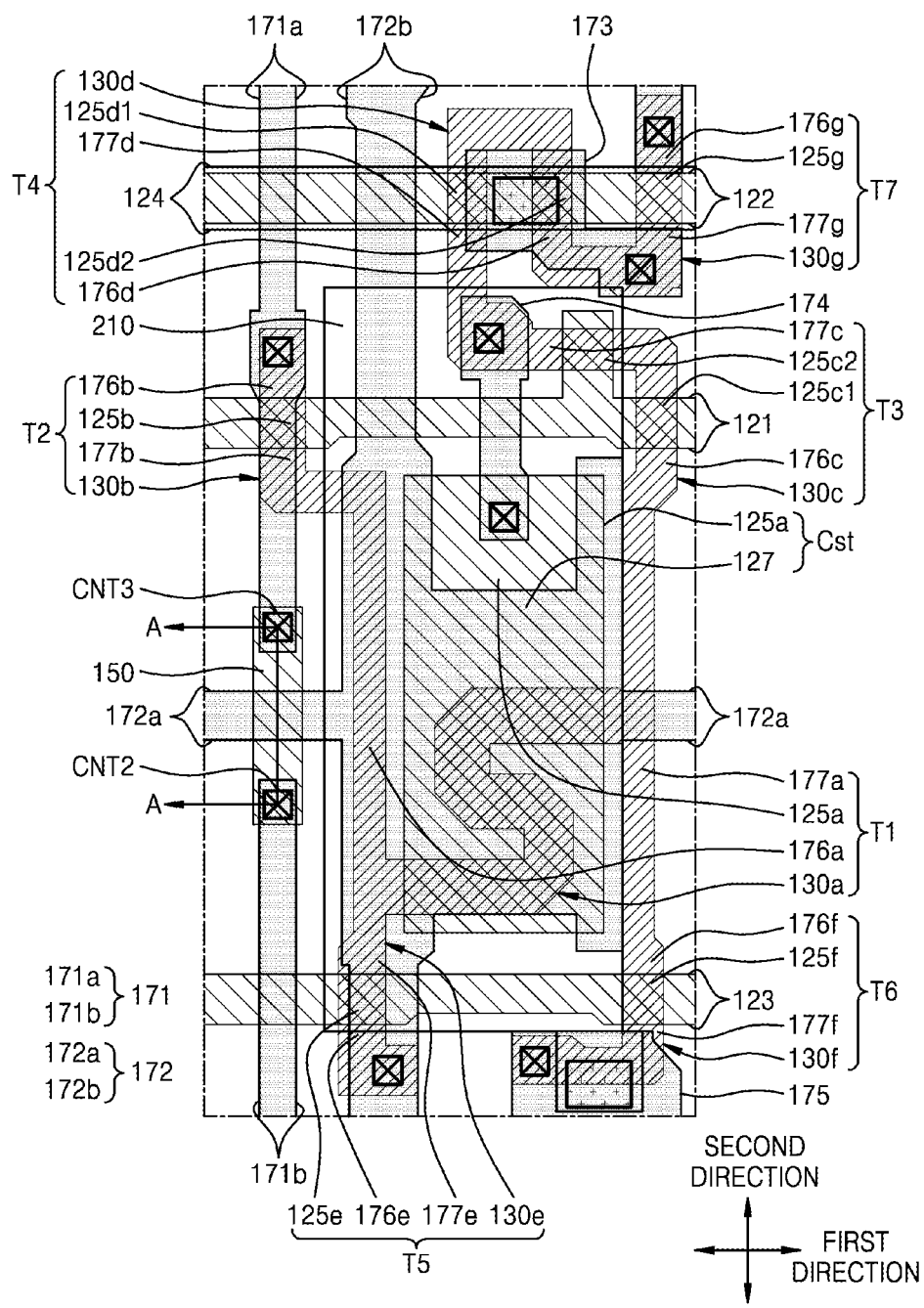
FIG. 3 is a schematic layout view of locations of a plurality of thin film transistors, a storage capacitor, and a pixel electrode of the pixel of FIG. 2.

FIG. 3 is a schematic layout view of locations of a plurality of thin film transistors, a storage capacitor, and a pixel electrode of the pixel of FIG. 2. FIGS. 4 through 7 are schematic layout views of, for each layer, components such as the plurality of thin film transistors, the storage capacitor, and the pixel electrode of FIG. 3. FIG. 8A is a cross-sectional view, taken along a line A-A' of FIG. 3.

FIGS. 4 through 7 are schematic layout views of wirings, electrodes, and semiconductor layers, etc. that are positioned over the same layer. Insulating layers may be interposed between layers shown in FIGS. 4 through 7. For example, a gate insulating layer 111 of FIG. 8A may be interposed between a layer of FIG. 4 and a layer of FIG. 5, an intermediate insulating layer 113 of FIG. 8A may be interposed between the layer of FIG. 5 and a layer of FIG. 6, and a planarization insulating layer 115 of FIG. 8A may be interposed between the layer of FIG. 6 and a layer of FIG. 7. The layers shown in FIGS. 4 through 7 may be electrically connected to each other through contact holes defined in at least some of the above-described insulating layers.

Referring to FIG. 3, the pixel PX may include the scan line 121, the previous scan line 122, the emission control line 123, and the initialization voltage line 124 that respectively apply the scan signal Sn, the previous scan signal Sn−1, the emission control signal En, and the initialization voltage Vint and extend in a first direction. The pixel PX may include the data line 171 and the driving voltage line 172 that extend in a second direction to intersect the scan line 121, the previous scan line 122, the emission control line 123, and the initialization voltage line 124 and respectively apply the data signal Dm and the driving voltage ELVDD. The pixel PX may include the TFTs T1 to T7, the storage capacitor Cst, and the organic light-emitting diode OLED (see FIG. 2) electrically connected to the TFTs T1 to T7 and the storage capacitor Cst. For convenience of description, the pixel PX will be described below according to a stacking order.

Figure 4:
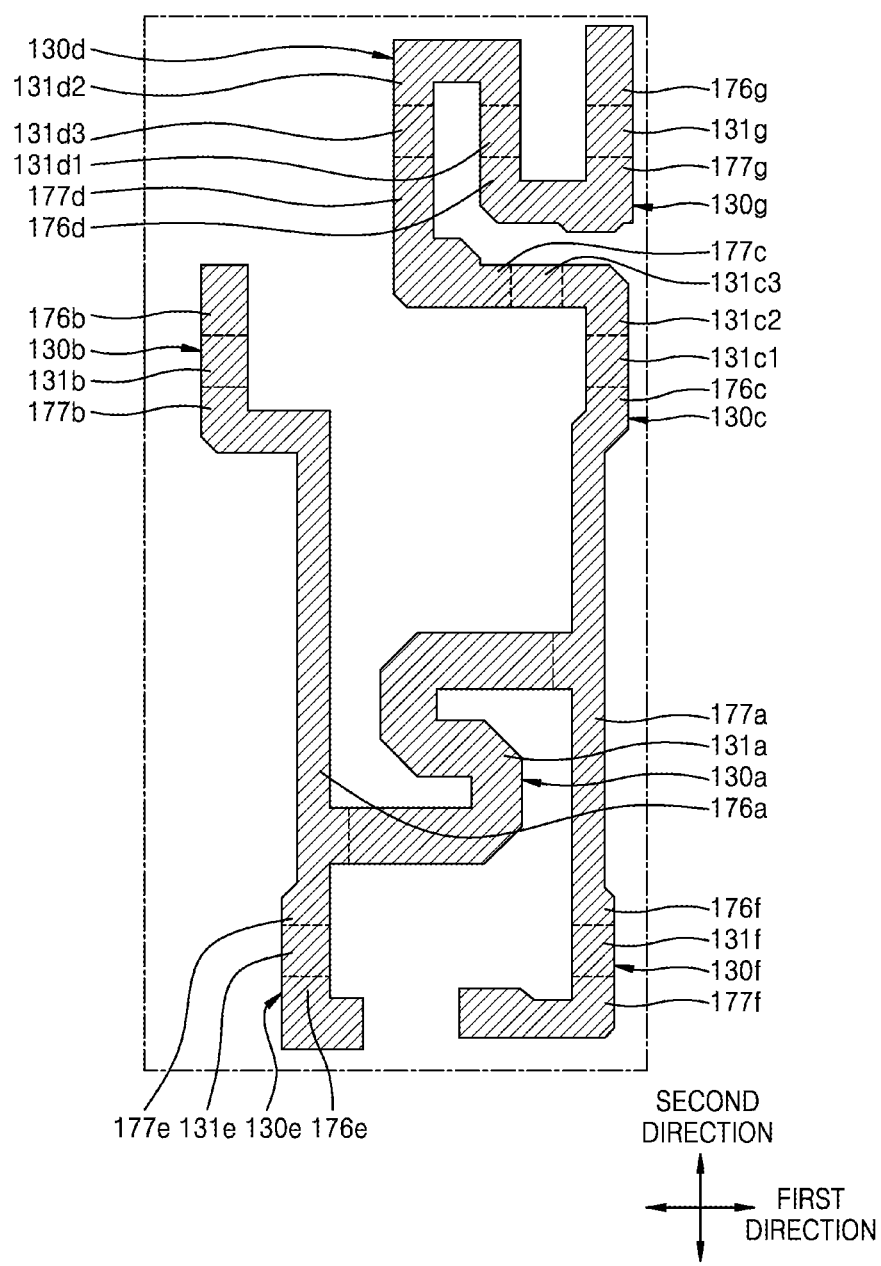
FIGS. 4, 5, 6, and 7 are schematic layout views of, for each layer, components such as the plurality of thin film transistors, the storage capacitor, and the pixel electrode of FIG. 3.
Figure 8A:
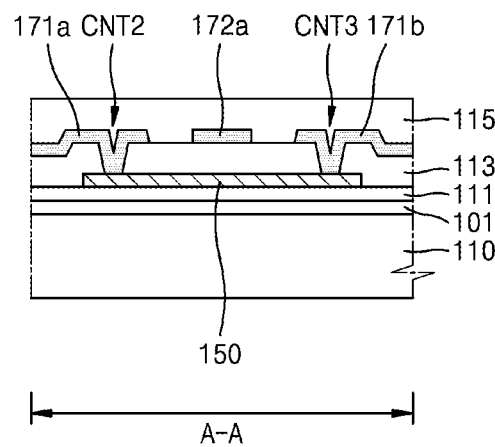
FIG. 8A is a cross-sectional view, taken along a line A-A' of FIG. 3.
Figure 8B:
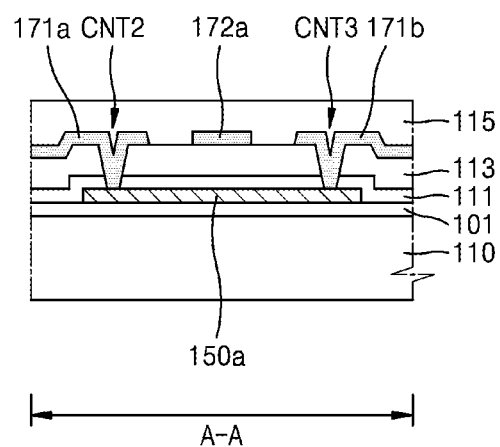
FIG. 8B is a cross-sectional view of a display device according to another embodiment.

Referring to FIGS. 3, 4, and 8, semiconductor layers 130a through 130g of the driving TFT T1, the switching TFT T2, the compensation T3, the first initialization TFT T4, the operation control TFT T5, the emission control TFT T6, and the second initialization TFT T7 may be arranged in the same layer and may include the same material. For example, the semiconductor layers 130a through 130g may include polycrystalline silicon.

The semiconductor layers 130a through 130g may be arranged over the buffer layer 101 (see FIG. 8A) disposed over the substrate 110. The substrate 110 may include a glass material, a metallic material, or a plastic material such as polyethylene terephthalate (PET), polyethylene naphthalate (PEN), polyimide (PI), etc. The buffer layer 101 may include an oxide layer such as SiOx and/or a nitride layer such as SiNx.

The driving semiconductor layer 130a of the driving TFT T1, the switching semiconductor layer 130b of the switching TFT T2, the compensation semiconductor layer 130c of the compensation TFT T3, the first initialization semiconductor layer 130d of the first initialization TFT T4, the operation control semiconductor layer 130e of the operation control TFT T5, the emission control semiconductor layer 130f of the emission control TFT T6, and the second initialization semiconductor layer 130g of the second initialization TFT T7 may be connected to each other and bent in various shapes.

The semiconductor layers 130a through 130g may include a channel region, and a source region and a drain region at two separate sides of the channel region. For example, the source region and the drain region may be doped with impurities, and the impurities may include N-type impurities or P-type impurities. The source region and the drain region respectively correspond to a source electrode and a drain electrode. Hereinafter, terms "source region" and "drain region" are used instead of the terms "source electrode" and "drain electrode."

The driving semiconductor layer 130a may include a driving channel region 131a, a driving source region 176a at one side of the driving channel region 131a and a driving drain region 177a at another side of the driving channel region 131a. The driving semiconductor layer 130a may have a bent shape so that the driving channel region 131a is longer than the other channel regions 131b through 131g. For example, the semiconductor layer 131a has a shape that is bent a plurality of number of times such as a letter "S" or an omega character "Ω," thereby forming a long channel length within a narrow space. Since the driving channel region 131a has a long shape, a driving range of a gate voltage applied to a driving gate electrode 125a widens, and thus a grayscale of light emitted from the organic light-emitting diode OLED may be more elaborately controlled and a display quality may be improved.

The switching semiconductor layer 130b may include a switching channel region 131b, and a switching source region 176b and a switching drain region 177b at two separate sides of the switching channel region 131b. The switching drain region 177b may be connected to the driving source region 176a.

The compensation semiconductor layer 130c may include compensation channel regions 131c1 and 131c3, and a compensation source region 176c and a compensation drain region 177c at two separate sides of the compensation channel regions 131c1 and 131c3. The compensation TFT T3 formed in the compensation semiconductor layer 130c may include the two compensation channel regions 131c1 and 131c3 as dual TFTs. A region 131c2 between the compensation channel regions 131c1 and 131c3 may be a region doped with impurities and may locally correspond to a source region of one of the dual TFTs and a drain region of the other one.

The first initialization semiconductor layer 130d may include first initialization channel regions 131d1 and 131d3, a first initialization source region 176d and a first initialization drain region 177d at two separate sides of the first initialization channel regions 131d1 and 131d3. The first initialization TFT T4 formed in the first initialization semiconductor layer 130d may include the two first initialization channel regions 131d1 and 131d3 as dual TFTs. A region 131d2 between the first initialization channel regions 131d1 and 131d3 may be a region doped with impurities and may locally correspond to a source region of one of the dual TFTs and a drain region of the other one.

The operation control semiconductor layer 130e may include an operation control channel region 131e, and an operation control source region 176e and an operation control drain region 177e at two separate sides of the operation control channel region 131e. The operation control drain region 177e may be connected to the driving source region 176a.

The emission control semiconductor layer 130f may include an emission control channel region 131f, and an emission control source region 176f and an emission control drain region 177f at two separate sides of the emission control channel region 131f. The emission control source region 176f may be connected to the driving drain region 177a.

The second initialization semiconductor layer 130g may include a second initialization channel region 131g, and a second initialization source region 176g and a second initialization drain region 177g at two separate sides of the second initialization channel region 131g.

The first gate insulating layer 111 may be positioned over the semiconductor layers 130a through 130g. The first gate insulating layer 111 may include an inorganic material including an oxide or a nitride. For example, the first gate insulating layer 111 may include silicon oxide ($SiO_2$), silicon nitride (SiNx), silicon oxynitride (SiO), aluminum oxide ($Al_2O_3$), titanium oxide ($TiO_2$), tantalum oxide ($Ta_2O_5$), hafnium oxide ($HfO_2$), or zinc oxide ($ZnO_2$), etc.

Figure 5:
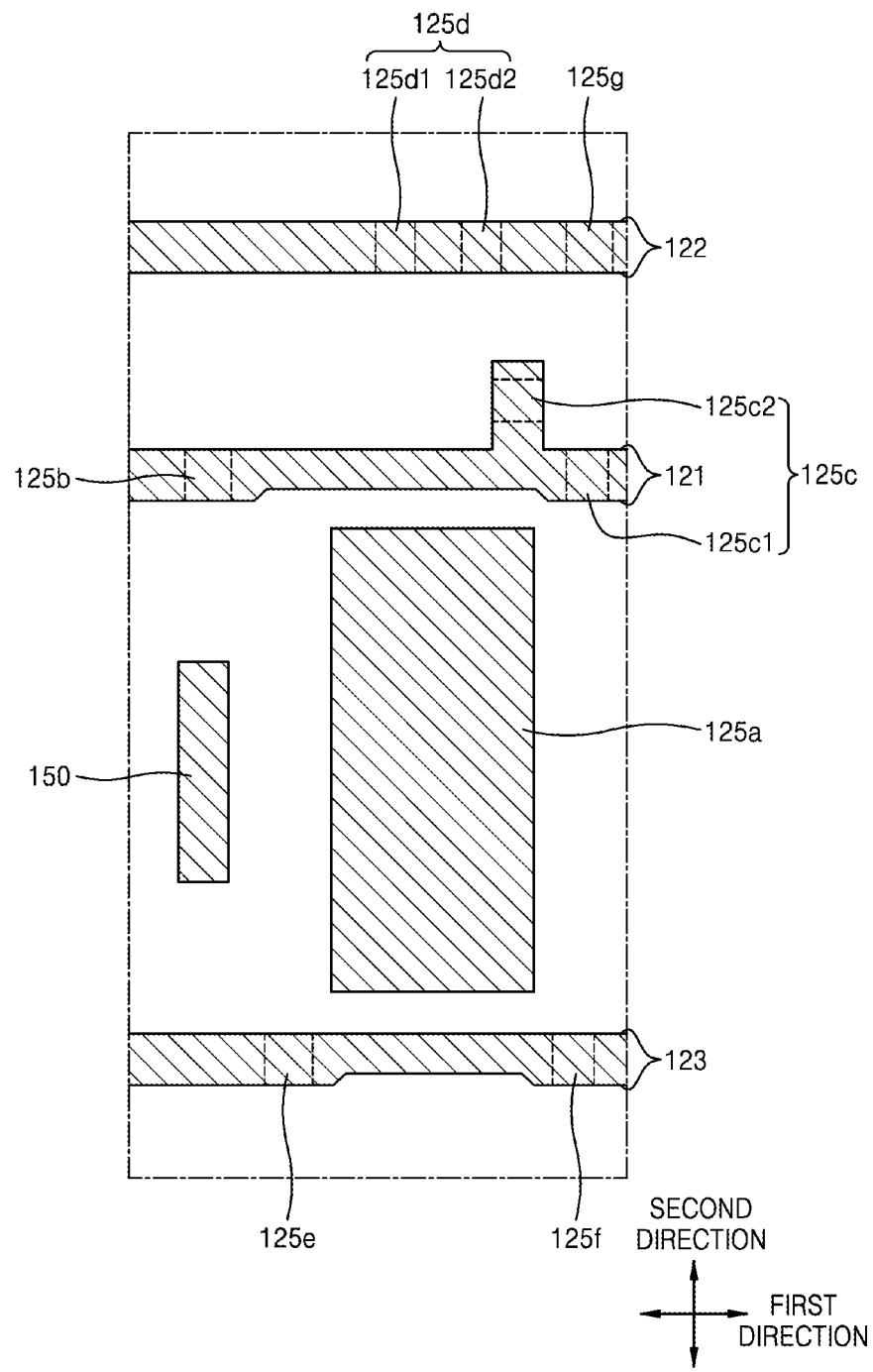

Referring to FIGS. 3, 5, and 8, the scan line 121, the previous scan line 122, the emission control line 123, the driving gate electrode 125a, and a connection line 150 may be arranged over the first gate insulating layer 111. The scan line 121, the previous scan line 122, the emission control line 123, the driving gate electrode 125a, and the connection line 150 may be arranged over the same layer and may include the same material. For example, the scan line 121, the previous scan line 122, the emission control line 123, the driving gate electrode 125a, and the connection line 150 may include molybdenum (Mo), aluminum (Al), copper (Cu), titanium (Ti), etc. and include a single layer or a multilayer.

The driving gate electrode 125a may be an island type and may overlap the driving channel region 131a of the driving semiconductor layer 130a. The driving gate electrode 125a may function as not only a gate electrode of the driving TFT T1 but also a first electrode of the storage capacitor Cst. That is, the driving gate electrode 125a and the first electrode of the storage capacitor Cst may be understood as being integrally formed as one body.

Some portions or protrusions of the scan line 121, the previous scan line 122, and the emission control line 123 may correspond to gate electrodes of the TFTs T2 through T7.

Regions of the scan line 121 that overlap the switching channel region 131b and the compensation channel regions 131c1 and 131c3 may respectively correspond to a switching gate electrode 125b and compensation gate electrodes 125c1 and 125c2. Regions of the previous scan line 122 that overlap the first initialization channel regions 131d1 and 131d3 and the second initialization channel region 131g may respectively correspond to first initialization gate electrodes 125d1 and 125d2 and a second initialization gate electrode 125g. Regions of the emission control line 123 that overlap the operation control channel region 131e and the emission control channel region 131f may respectively correspond to an operation control gate electrode 125e and an emission control gate electrode 125f.

The compensation gate electrodes 125c1 and 125c2 may be dual gate electrodes including the first compensation gate electrode 125c1 and the second compensation gate electrode 125c2 and may prevent or reduce the occurrence of a leakage current.

The connection line 150 may overlap an end of a first data line 171a and an end of a second data line 171b that face each other and may approximately extend in a second direction. The connection line 150 may overlap a horizontal driving voltage line 172a. The connection line 150 may be arranged to connect the first data line 171a and the second data line 171b through contact holes CNT2 and CNT3.

The intermediate insulating layer 113 may be positioned over the scan line 121, the previous scan line 122, the emission control line 123, the driving gate electrode 125a, and the connection line 150. The intermediate insulating layer 113 may include an inorganic material including an oxide or a nitride. For example, the intermediate insulating layer 113 may include $SiO_2$, SiNx, SiON, $Al_2O_3$, $TiO_2$, $Ta_2O_5$, $HfO_2$, or $ZnO_2$, etc.

Figure 6:
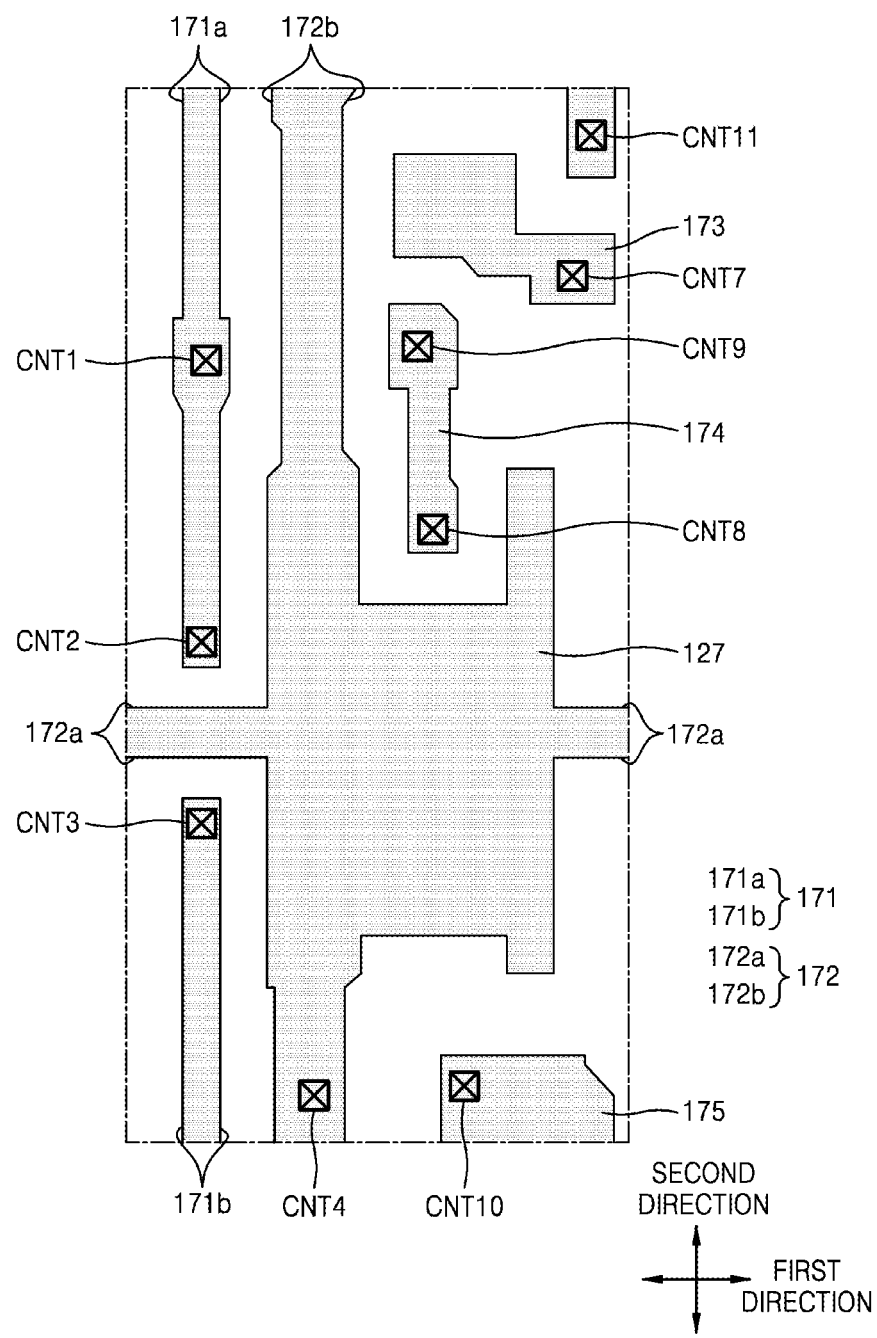

Referring to FIGS. 3, 6, and 8, the data line 171, the driving voltage line 172, an initialization connection line 173, a second electrode 127 of the storage capacitor Cst, a node connection line 174, and an intermediate connection layer 175 may be positioned over the intermediate insulating layer 113. The data line 171 may include a first data line 171a and a second data line 171b. The driving voltage line 172 may include a horizontal driving voltage line 172a extending in a first direction and a vertical driving voltage line 172b extending in a second direction.

The first data line 171a, the second data line 171b, the horizontal driving voltage line 172a, the vertical driving voltage line 172b, the second electrode 127 of the storage capacitor Cst, the node connection line 174, and the intermediate connection layer 175 may be arranged over the same layer and may include the same material. For example, the first data line 171a, the second data line 171b, the horizontal driving voltage line 172a, the vertical driving voltage line 172b, the second electrode 127 of the storage capacitor Cst, the node connection line 174, and the intermediate connection layer 175 may include a conductive material including Mo, Al, Cu, Ti, etc. and include a multilayer or a single layer including the above materials. For example, the first data line 171a, the second data line 171b, the horizontal driving voltage line 172a, the vertical driving voltage line 172b, the second electrode 127 of the storage capacitor Cst, the node connection line 174, and the intermediate connection layer 175 may have a multi-layered structure including Ti/Al/Ti.

The first data line 171a and the second data line 171b may extend in the second direction. The first data line 171a may be connected to the switching source region 176b of the switching TFT T2 through a contact hole CNT1 passing through the intermediate insulating layer 113.

The first data line 171 may be separated into the first data line 171a and the second data line 171b in order to prevent collision with the horizontal driving voltage line 172a. The horizontal driving voltage line 172a may be disposed in a space between the first data line 171a and the second data line 171b. The first data line 171a and the second data line 171b may be connected to the connection line 150 arranged in a lower layer through the contact holes CNT2 and CNT3.

The horizontal driving voltage line 172a may extend in the first direction. The vertical driving voltage line 172b may extend in the second direction. Accordingly, the display device according to the embodiments may include the horizontal driving voltage line 172a and the vertical driving voltage line 172b that intersect each other so that the display device includes the driving voltage line 172 of a mesh structure, thereby preventing a voltage drop of a driving voltage.

The vertical driving voltage line 172b may be connected to the operation control source region 176e of the operation control TFT T5 through a contact hole CNT4 defined in the interlayer insulating layer 113.

The second electrode 127 of the storage capacitor Cst may be arranged over the same layer as and may include the same material as the horizontal driving voltage line 172a and the vertical driving voltage line 172b. The second electrode 127 of the storage capacitor Cst may be integrally formed with the horizontal driving voltage line 172a and the vertical driving voltage line 172b. In other words, a part of the second electrode 127 may extend in the first direction and may be provided as the horizontal driving voltage line 172a, and another part thereof may extend in the second direction and may be provided as the vertical driving voltage line 172b.

In the embodiments, the horizontal driving voltage line 172a may extend from the second electrode 127 of the storage capacitor Cst, thereby forming the driving voltage line 172 of the mesh structure without having to obtaining a space for a separate driving voltage line extending in the first direction. Accordingly, a space of the storage capacitor Cst may be further obtained, thereby implementing the display device of a high quality.

The initialization connection line 173 may transfer the initialization voltage Vint initializing the driving TFT T1 and the pixel electrode 210. The initialization connection line 173 may be connected to the first and second initialization TFTs T4 and T7 through a contact hole CNT7 defined in the intermediate layer 113 and may be connected to an initialization voltage line 124 that will be described below with reference to FIG. 7.

The node connection line 174 may connect the driving gate electrode 125a and a compensation drain region 177c of the compensation TFT T3 through contact holes CNT8 and CNT9. The driving gate electrode 125a may be an island type and be electrically connected to the compensation TFT T3 by the node connection line 174.

The intermediate connection layer 175 may be connected to the emission control TFT T6 through a contact hole CNT10. For example, the intermediate connection layer 175 may be connected to the emission control drain region 177f of the emission control TFT T6. The intermediate connection layer 175 may be connected to the second initialization source region 176g of the second initialization TFT T7 through a contact hole CNT11.

A planarization insulating layer 115 may be positioned over the first data line 171a, the second data line 171b, the horizontal driving voltage line 172a, the vertical driving voltage line 172b, the second electrode 127 of the storage capacitor Cst, the node connection line 174, and the intermediate connection layer 175. The planarization insulating layer 115 may include an organic material such as acryl, benzocyclobutene (BCB), polyimide, or hexamethyldisiloxane (HMDSO). Alternatively, the planarization insulating layer 115 may include an inorganic material.

Figure 7:
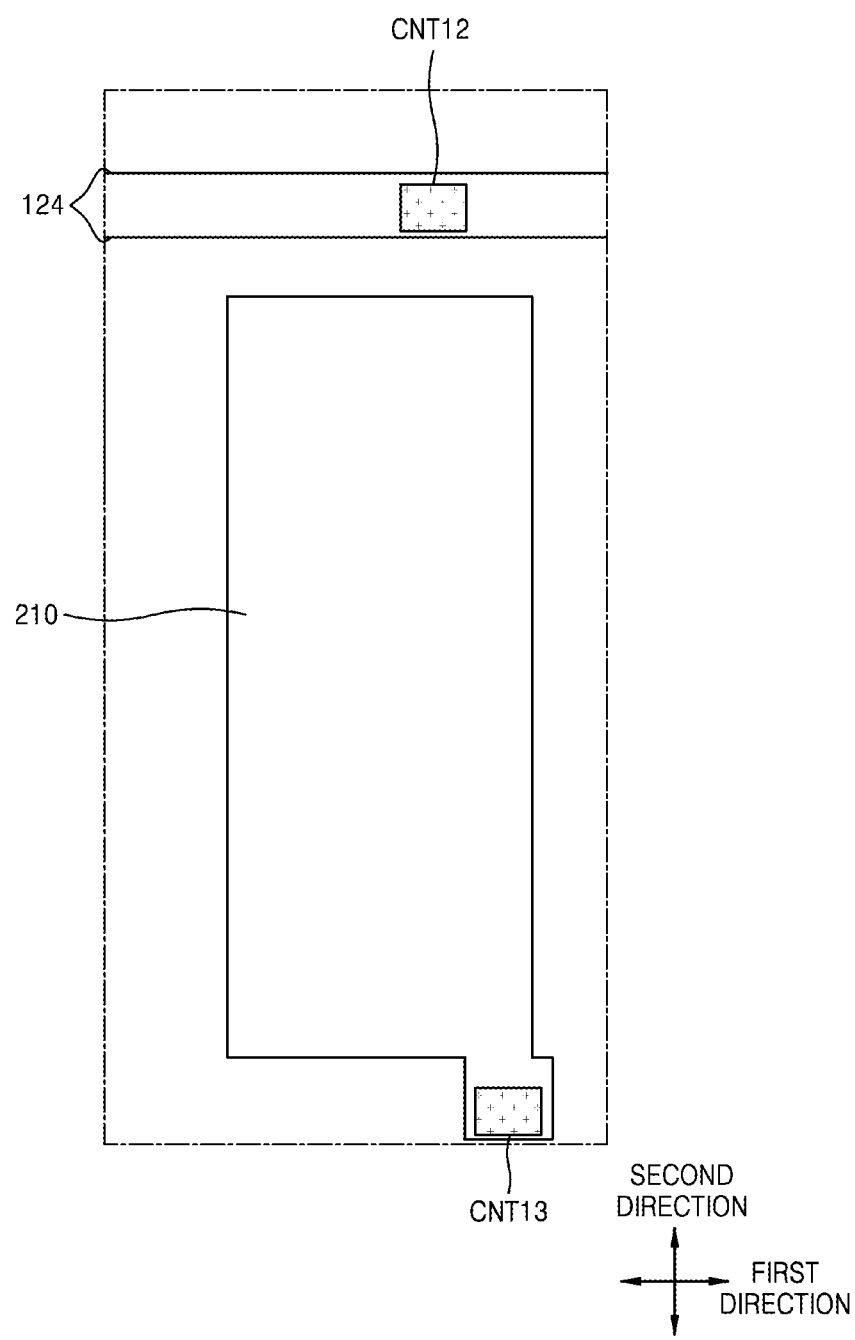

Referring to FIGS. 3, 7, and 8, the initialization voltage line 124 and the pixel electrode 210 may be positioned over the planarization insulating layer 115. The initialization voltage line 124 and the pixel electrode 210 may be arranged over the same layer and may include the same material.

The initialization voltage line 124 may be connected to the initialization connection line 173 through the contact hole CNT2 defined in the planarization insulating layer 115 and may be connected to the first and second initialization TFTs T4 and T7 by the initialization connection line 173.

The pixel electrode 210 may be connected to the intermediate connection layer 175 through a contact hole CNT13 defined in the planarization insulating layer 115. The pixel electrode 210 may be connected to the emission control drain region 177f of the emission control TFT T6 by the intermediate connection layer 175.

The pixel electrode 210 may be a reflective electrode. For example, the pixel electrode 210 may include a reflective layer including Ag, Mg, Al, Pt, Pd, Au, Ni, Nd, Ir, Cr, and a compound thereof, and a transparent or semi-transparent electrode layer formed over the reflective layer. The transparent or semi-transparent electrode layer may include at least one selected from the group consisting of indium tin oxide (ITO), indium zinc oxide (IZO), zinc oxide (ZnO), $In_2O_3$, indium gallium oxide (IGO), and aluminum zinc oxide (AZO).

Although not shown, an emission layer including an organic material including a fluorescent or phosphorous material that emits red, green, blue, or white light may be arranged over the pixel electrode 210. The emission layer may include a low molecular organic material or a high molecular organic material and may selectively further include a functional layer such as a hole transport layer (HTL), a hole injection layer (HIL), an electron transport layer (ETL), and an electron injection layer (EIL) above and below the emission layer.

An opposite electrode (not shown) may be arranged on the emission layer. The opposite electrode may be a transmissive electrode. For example, the opposite electrode may be a transparent or semi-transparent electrode and may include a metallic thin film having a small work function and including Li, Ca, LiF/Ca, LiF/Al, Ag, Mg, and a compound thereof. A transparent conductive oxide (TCO) layer such as ITO, IZO, ZnO or $In_2O_3$ may be further arranged above the metallic thin film.

The connection line 150 is illustrated as being arranged over the same layer as the scan line 121, the previous scan line 122, the emission control line 123, and the driving gate electrode 125a in FIGS. 3 through 8 but is not limited thereto. For example, the connection line 150 may be arranged over the same layer as the driving semiconductor layer 130a, the switching semiconductor layer 130b, the compensation semiconductor layer 130c, etc. That is, as shown in FIG. 8B, a connection line 150a may be disposed between the buffer layer 101 and the first gate insulating layer 111 and may be arranged over the same layer as the driving semiconductor layer 130a (see FIG. 4), etc. In this case, the connection line 150a may be formed of a semiconductor material such as silicon and then may be made conductive by doping the semiconductor material with impurities. The connection line 150a may be connected to the first data line 171a and the second data line 171b by the contact holes CNT2 and CNT3 that pass through the intermediate layer 113 and the first gate insulating layer 111.

Figure 8C:
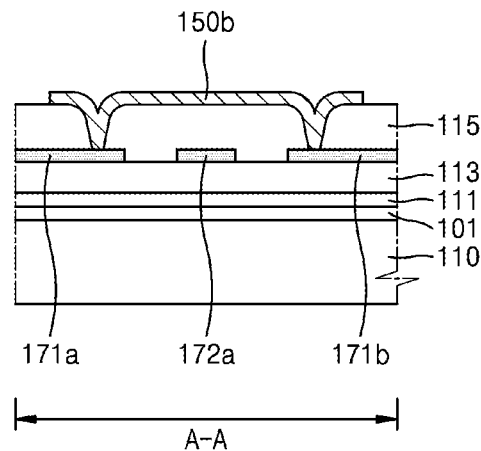
FIG. 8C is a cross-sectional view of a display device according to another embodiment.

As another embodiment, a connection line 150b may be arranged over the same layer as the pixel electrode 210. That is, as shown in FIG. 8C, the connection line 150b may be arranged over the planarization insulating layer 115 and may be arranged over the same layer as the pixel electrode 210 (see FIG. 7). In this case, the connection line 150b may include the same material as the pixel electrode 210 and may be formed simultaneously with the pixel electrode 210. The connection line 150b may be connected to the first data line 171a and the second data line 171b through a contact hole that passes through the planarization insulating layer 115.

Figure 9:
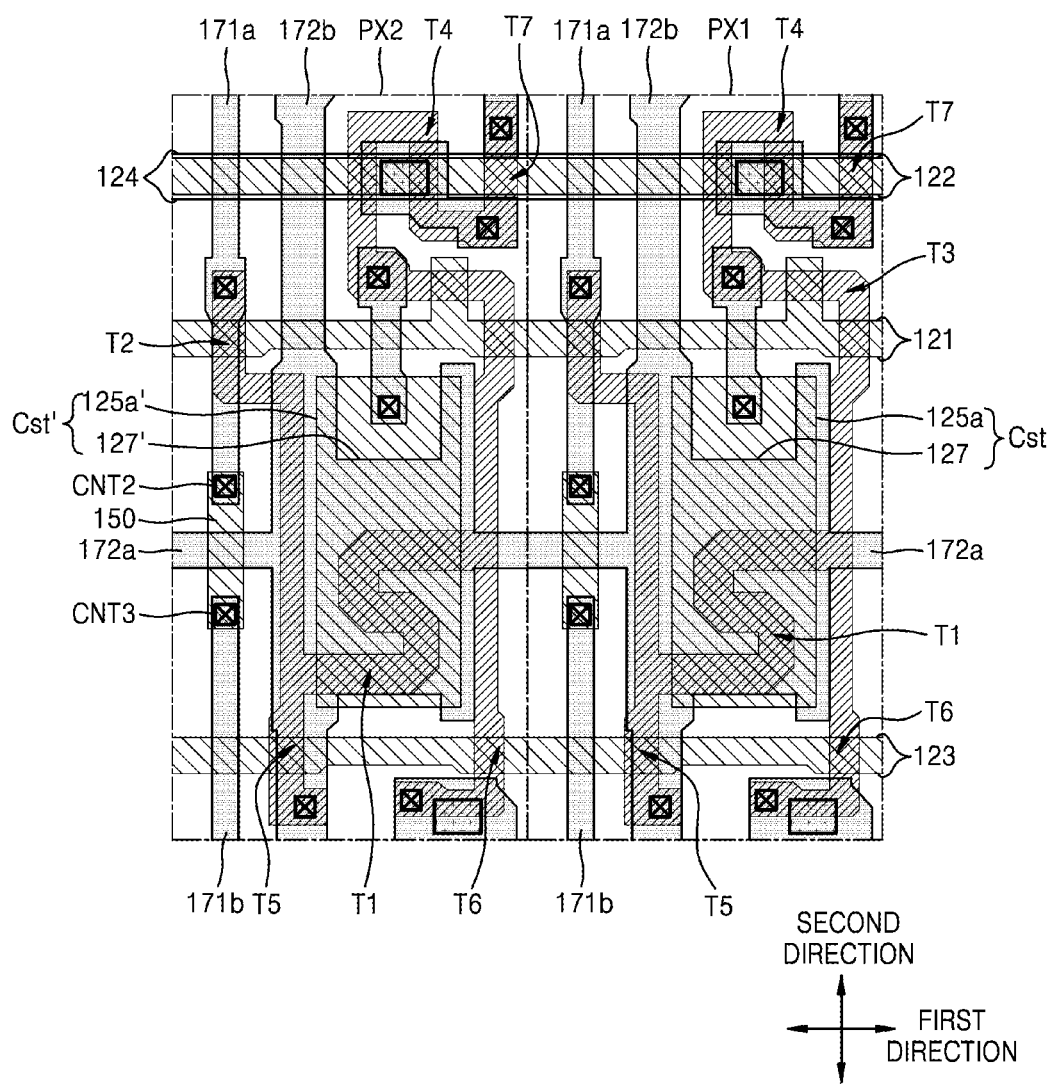
FIG. 9 is a schematic plan view of two neighboring pixels included in a display device according to an embodiment.

FIG. 9 is a schematic plan view of two neighboring pixels included in a display device according to an embodiment. For convenience of description, one of the two neighboring pixels is a first pixel PX1 and the other one is a second pixel PX2 below. In FIG. 9, for convenience of description, the pixel electrode 210 (see FIG. 3) is omitted.

Referring to FIG. 9, the horizontal driving voltage line 172a may be arranged over the same layer as the second electrode 127 of the storage capacitor Cst of the first pixel PX1 and a second electrode 127' of a storage capacitor Cst' of the second pixel PX2 and may connect the second electrodes 127 and 127'. In other words, the horizontal driving voltage line 172a may be integrally formed with the second electrode 127 of the storage capacitor Cst of the first pixel PX1 and the second electrode 127' of the storage capacitor Cst' of the second pixel PX2.

In an embodiment, as shown in FIG. 9, the display device may have a non-flip structural format in which the driving TFT T1 of each of a plurality of pixels is arranged in parallel in a first direction and has the same shape. However, the disclosure is not limited thereto, and thus the display device has a flip structural format in which pairs of a plurality of pixels are diagonally arranged.

Figure 10:
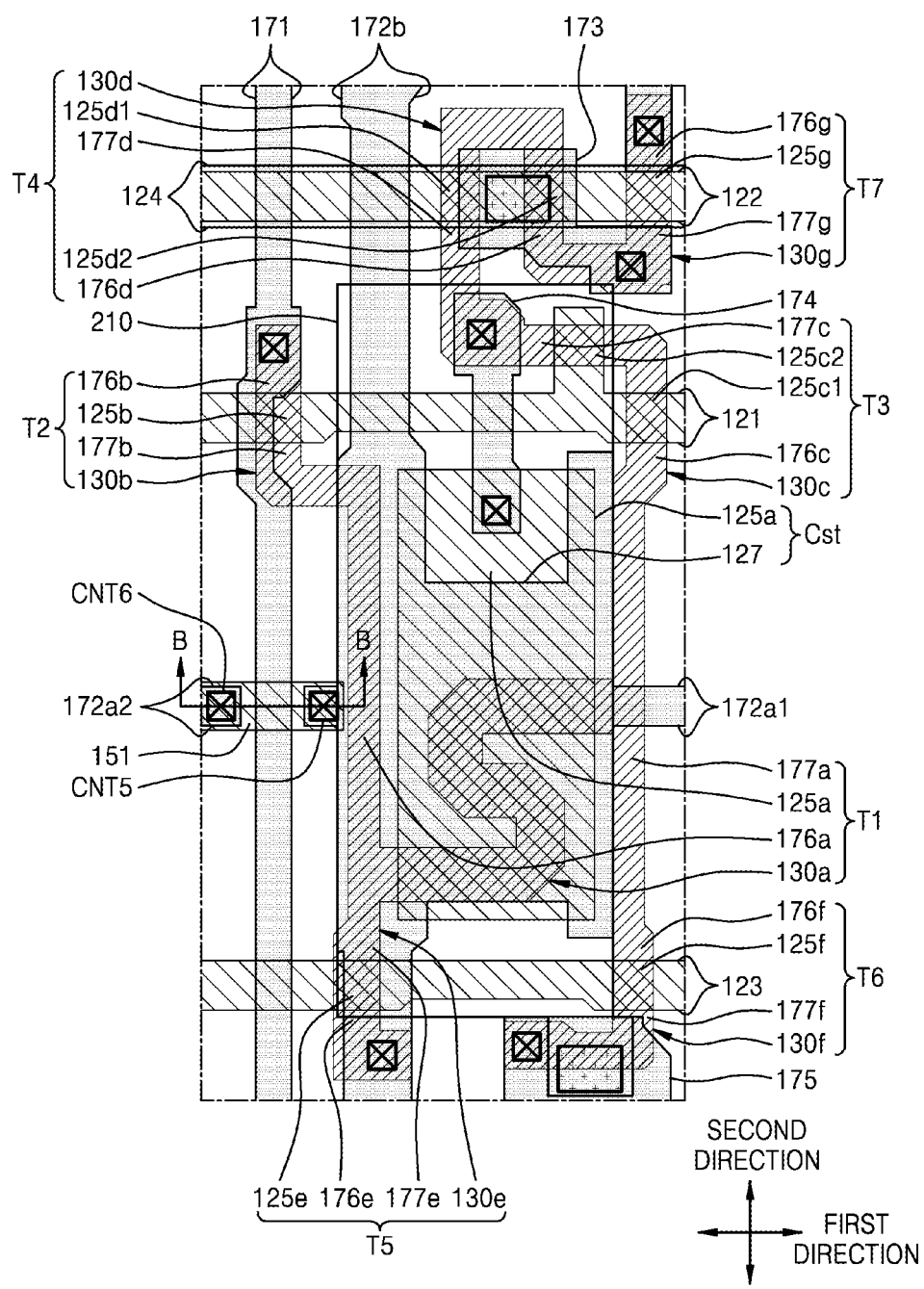
FIG. 10 is a schematic layout view of locations of a plurality of thin film transistors, a storage capacitor, and a pixel electrode of one pixel of a display device according to another embodiment.
Figure 11:
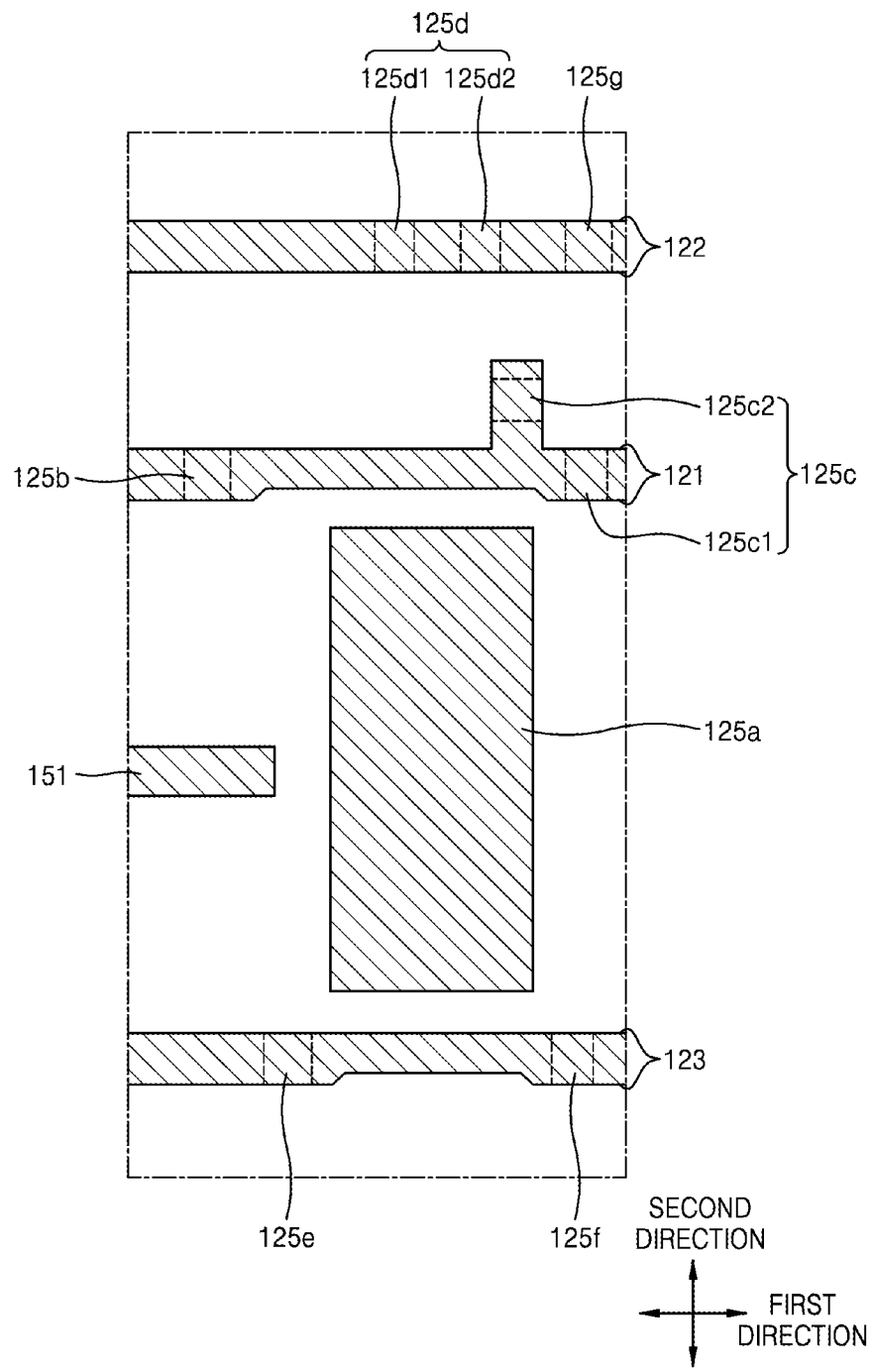
FIGS. 11 and 12 are schematic layout views of a layer over which a second electrode and a connection line are arranged among components of FIG. 10.
Figure 12:
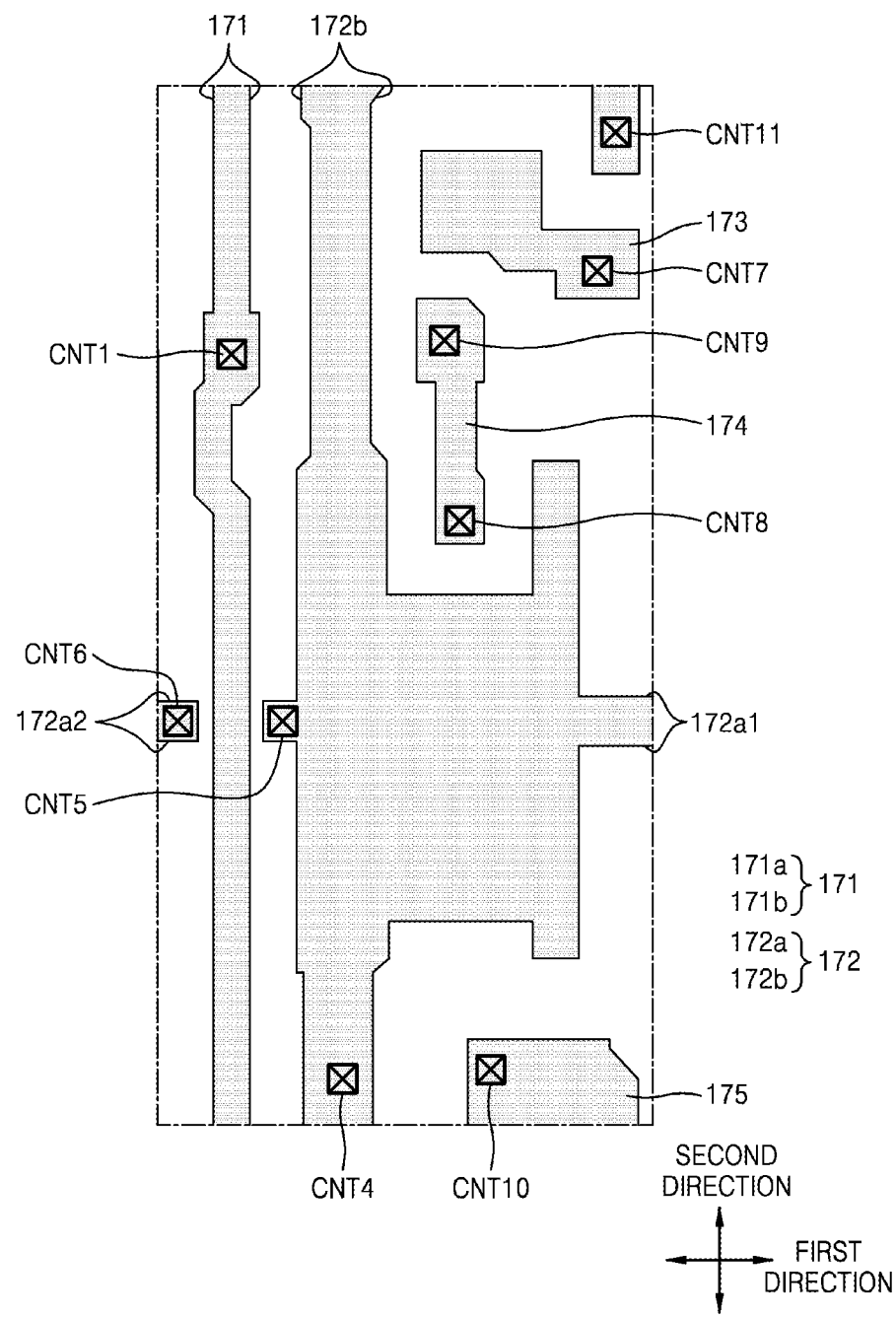
Figure 13A:
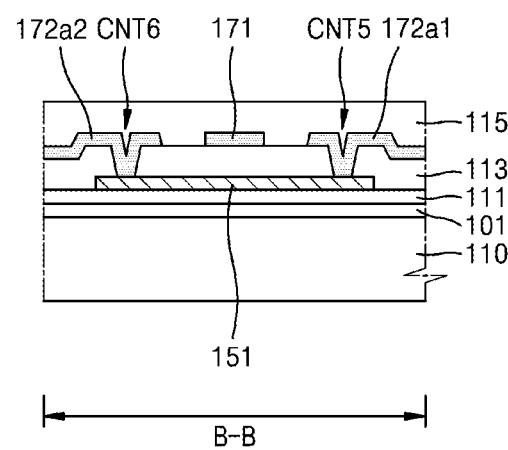
FIG. 13A is a cross-sectional view, taken along a line B-B' of FIG. 10.
Figure 13B:
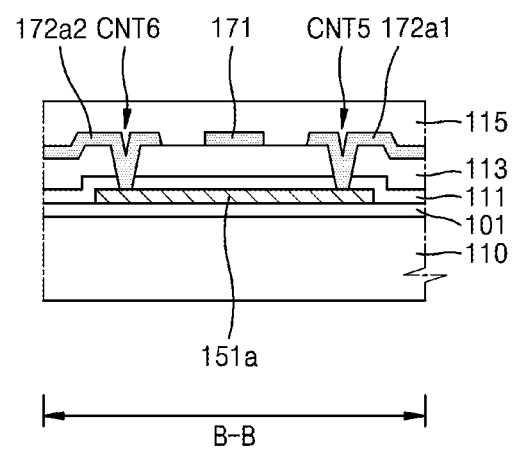
FIG. 13B is a cross-sectional view of a display device according to another embodiment.

FIG. 10 is a schematic layout view of locations of a plurality of thin film transistors, a storage capacitor, and a pixel electrode of one pixel of a display device according to another embodiment. FIGS. 11 and 12 are schematic layout views of a layer over which a second electrode and a connection line are arranged among components of FIG. 10. FIG. 13A is a cross-sectional view, taken along a line B-B' of FIG. 10. The same reference numerals between FIGS. 10 through 13 and FIGS. 3 through 8 denote the same components. For brevity of description, redundant descriptions are omitted here.

Referring to FIGS. 10, 11, and 13, the scan line 121, the previous scan line 122, the emission control line 123, the driving gate electrode 125a, and a connection line 151 may be arranged over the first gate insulating layer 111. The scan line 121, the previous scan line 122, the emission control line 123, the driving gate electrode 125a, and the connection line 150 may be arranged over the same layer and may include the same material. For example, the scan line 121, the previous scan line 122, the emission control line 123, the driving gate electrode 125a, and the connection line 150 may include molybdenum (Mo), aluminum (Al), copper (Cu), titanium (Ti), etc. and include a single layer or a multilayer.

The connection line 151 may overlap an end of a first horizontal driving voltage line 172a1 and an end of a second horizontal driving voltage line 172a2 that face each other and may approximately extend in a first direction. The connection line 151 may partially overlap the data line 171. The connection line 151 may be arranged to connect the first horizontal driving voltage line 172a1 and the second horizontal driving voltage line 172a2 through contact holes CNT5 and CNT6.

Referring to FIGS. 10, 12, and 13, the data line 171, the driving voltage line 172, the initialization connection line 173, the second electrode 127 of the storage capacitor Cst, the node connection line 174, and the intermediate connection layer 175 may be positioned over the intermediate insulating layer 113. The driving voltage line 172 may include the horizontal driving voltage line 172a extending in a first direction and the vertical driving voltage line 172b extending in a second direction. The driving voltage line 172 may include the first horizontal driving voltage line 172a1 and the second horizontal driving voltage line 172a2 that are separated from each other.

The data line 171, first horizontal driving voltage line 172a1, the second horizontal driving voltage line 172a2, the vertical driving voltage line 172b, the second electrode 127 of the storage capacitor Cst, the initialization connection line 173, the node connection line 174, and the intermediate connection layer 175 may be arranged over the same layer and may include the same material. For example, the data line 171, the first horizontal driving voltage line 172a1, the second horizontal driving voltage line 172a2, the vertical driving voltage line 172b, the second electrode 127 of the storage capacitor Cst, the initialization connection line 173, the node connection line 174, and the intermediate connection layer 175 may include a conductive material including Mo, Al, Cu, Ti, etc. and include a multilayer or a single layer including the above materials. For example, the data line 171, the first horizontal driving voltage line 172a1, the second horizontal driving voltage line 172a2, the vertical driving voltage line 172b, the second electrode 127 of the storage capacitor Cst, the initialization connection line 173, the node connection line 174, and the intermediate connection layer 175 may have a multi-layered structure including Ti/A/Ti.

The data line 171 may be connected to the switching source region 176b of the switching TFT T2 through the contact hole CNT1 passing through the intermediate insulating layer 113. The data line 171 may extend in a second direction by passing a space between the first horizontal driving voltage line 172a1 and the second horizontal driving voltage line 172a2.

The horizontal driving voltage line 172a may be separated into the first horizontal driving voltage line 172a1 and the second horizontal driving voltage line 172a2 in order to prevent a short from the data line 171. The data line 171 may be disposed in the space between the first horizontal driving voltage line 172a1 and the second horizontal driving voltage line 172a2 and may be spaced apart from the first horizontal driving voltage line 172a1 and the second horizontal driving voltage line 172a2.

The second electrode 127 of the storage capacitor Cst may be arranged over the same layer as and may include the same material as the first horizontal driving voltage line 172a1, the second horizontal driving voltage line 172a2, and the vertical driving voltage line 172b. The second electrode 127 of the storage capacitor Cst may be integrally formed with the first horizontal driving voltage line 172a1 and the vertical driving voltage line 172b. In other words, a part of the second electrode 127 may extend in the first direction and may be provided as the first horizontal driving voltage line 172a1, and another part thereof may extend in the second direction and may be provided as the vertical driving voltage line 172b.

In the embodiments, the first horizontal driving voltage line 172a1 may extend from the second electrode 127 of the storage capacitor Cst, thereby forming the driving voltage line 172 of a mesh structure without having to obtaining a space for a separate driving voltage line extending in the first direction. Accordingly, a space of the storage capacitor Cst may be further obtained, thereby implementing the display device of a high quality.

The connection line 151 is illustrated to be arranged over the same layer as the scan line 121, the previous scan line 122, the emission control line 123, and the driving gate electrode 125a in FIGS. 10 through 13, but is not limited thereto. For example, the connection line 151 may be arranged over the same layer as the driving semiconductor layer 130a, the switching semiconductor layer 130b, the compensation semiconductor layer 130c, etc. That is, as shown in FIG. 13B, a connection line 151a may be disposed between the buffer layer 101 and the first gate insulating layer 111 and may be arranged over the same layer as the driving semiconductor layer 130a (see FIG. 4), etc. In this case, the connection line 151a may be formed of a semiconductor material such as silicon and may be made conductive by doping the semiconductor material with impurities. The connection line 151a may be connected to the first horizontal driving voltage line 172a1 and the second horizontal driving voltage line 172a2 by the contact holes CNT5 and CNT6 that pass through the intermediate layer 113 and the first gate insulating layer 111.

Figure 13C:
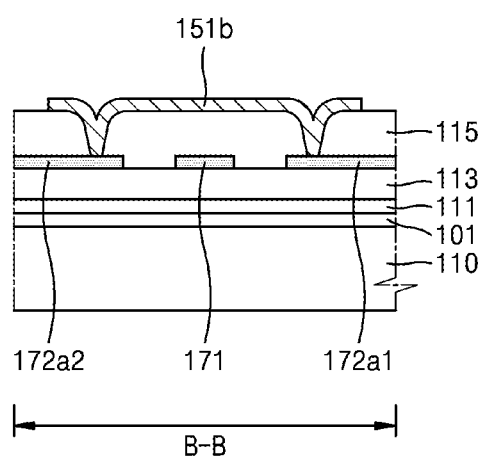
FIG. 13C is a cross-sectional view of a display device according to another embodiment.

As another embodiment, a connection line 151b may be arranged over the same layer as the pixel electrode 210. That is, as shown in FIG. 13C, the connection line 151b may be arranged over the planarization insulating layer 115 and may be arranged over the same layer as the pixel electrode 210 (see FIG. 7). In this case, the connection line 151b may include the same material as the pixel electrode 210 and may be formed simultaneously with the pixel electrode 210. The connection line 151b may be connected to the first horizontal driving voltage line 172a1 and the second horizontal driving voltage line 172a2 through a contact hole that passes through the planarization insulating layer 115.

Figure 14:
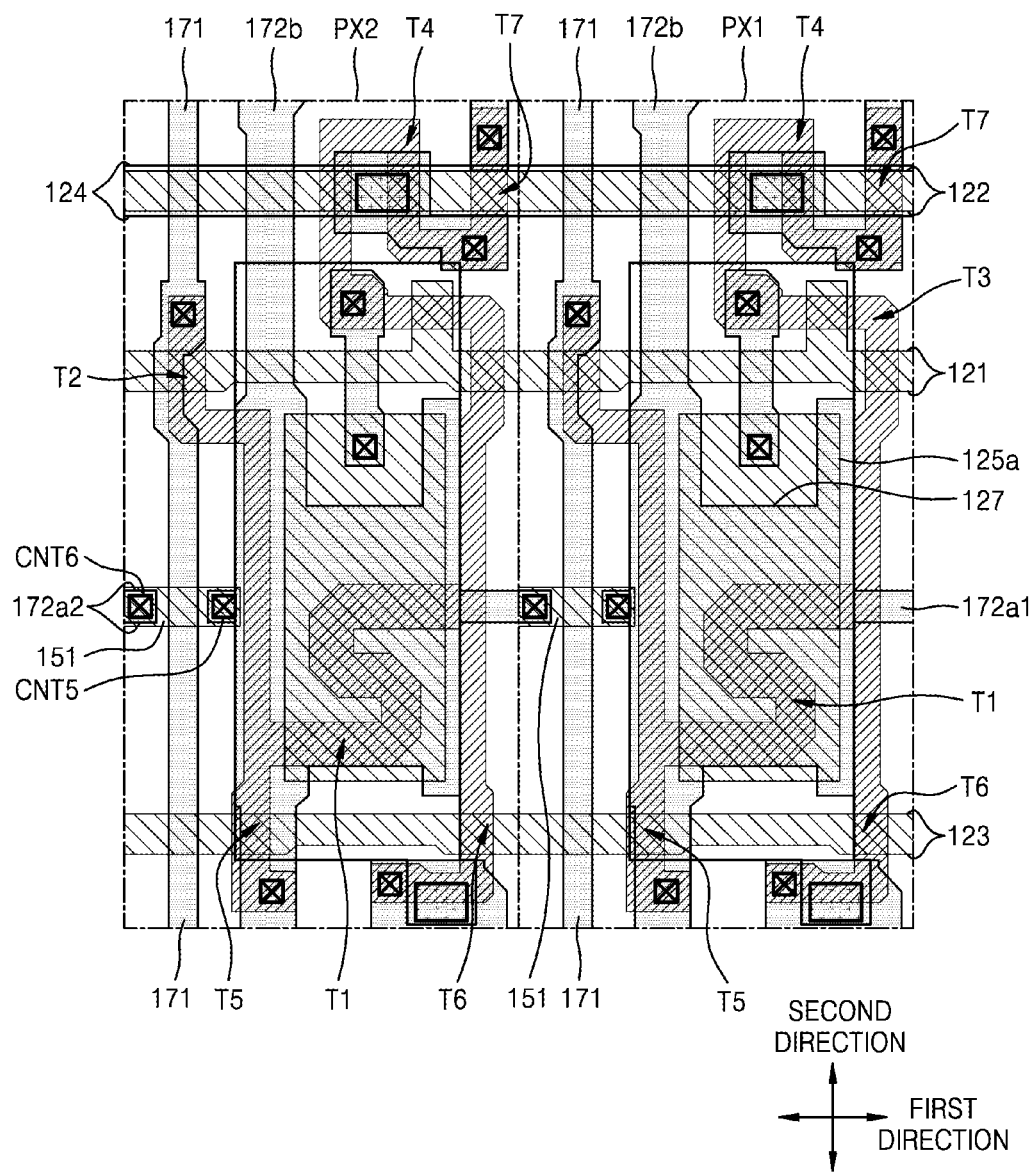
FIG. 14 is a schematic plan view of two neighboring pixels included in a display device according to another embodiment.

FIG. 14 is a schematic plan view of two neighboring pixels included in a display device according to another embodiment. For convenience of description, one of the two neighboring pixels is the first pixel PX1 and the other one is the second pixel PX2 below. In FIG. 14, for convenience of description, the pixel electrode 210 (see FIG. 3) is omitted.

Referring to FIG. 14, the vertical driving voltage line 172b of each of the first pixel PX1 and the second pixel PX2 may extend in a second direction and may be integrally formed with the second electrode 127 of the storage capacitor Cst included in each of the first pixel PX1 and the second pixel PX2. The first horizontal driving voltage line 172a1 and the second horizontal driving voltage line 172a2 of each of the first pixel PX1 and the second pixel PX2 may extend in a first direction and may be integrally formed with the second electrode 127 of the storage capacitor Cst included in each of the first pixel PX1 and the second pixel PX2. The second horizontal driving voltage line 172a2 of the first pixel PX1 may be connected to the first horizontal driving voltage line 172a1 of the second pixel PX2 by the connection line 151, and thus a mesh structure may be completed.

In an embodiment, as shown in FIG. 14, the display device may have a non-flip structural format in which the driving TFT T1 of each of a plurality of pixels is arranged in parallel in the first direction and has the same shape. However, the disclosure is not limited thereto. The display device may have a flip structural format in which pairs of a plurality of pixels are diagonally arranged.

As described above, a display device according to the embodiments may include a driving voltage line in the form of a mesh structure including a horizontal driving voltage line and a vertical driving voltage line), thereby preventing a voltage drop of a driving voltage. The horizontal driving voltage line may extend from one electrode of a storage capacitor, and thus the display device does not need to obtain a separate space, thereby achieving high integration.

These effects do not limit the scope of the disclosure.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by one of ordinary skill in the art that various changes in form and details may be made therein without departing from the spirit and scope as defined by the following claims.

What is claimed is:

1. A display device comprising a plurality of pixels, wherein a first pixel of the plurality of pixels comprises:
   a scan line extending in a first direction;
   a data line extending in a second direction;
   a switching thin film transistor (TFT) connected to the scan line and the data line;
   a driving TFT connected to the switching TFT and comprising a driving gate electrode;
   a storage capacitor comprising the driving gate electrode as a first electrode and a second electrode arranged above the first electrode and overlapping the first electrode;
   a horizontal driving voltage line extending from the second electrode in the first direction; and
   a vertical driving voltage line extending from the second electrode in the second direction,
   wherein the horizontal driving voltage line, the vertical driving voltage line, and the data line are arranged over a same layer.

2. The display device of claim 1, wherein the first pixel of the plurality of pixels further comprises a connection line arranged over a different layer from the data line,
   wherein the data line comprises a first data line and a second data line that are spaced apart from each other, and
   wherein the first data line and the second data line are connected to the connection line through a first contact hole and a second contact hole, respectively.

3. The display device of claim 2, wherein the horizontal driving voltage line extends in the first direction by extending through a space between the first data line and the second data line.

4. The display device of claim 2, wherein the horizontal driving voltage line, the vertical driving voltage line, and the second electrode are integrally formed together.

5. The display device of claim 2, wherein the horizontal driving voltage line is connected to a second electrode of a storage capacitor of a second pixel neighboring the first pixel.

6. The display device of claim 2, wherein the connection line is arranged below the data line with at least one insulating layer disposed between the connection line and the data line.

7. The display device of claim 2, wherein the connection line is arranged over a same layer as the driving gate electrode.

8. The display device of claim 1, wherein the first pixel of the plurality of pixels further comprises a connection line arranged over a different layer from the horizontal driving voltage line,
   wherein the horizontal driving voltage line comprises a first horizontal driving voltage line and a second horizontal driving voltage line that are spaced apart from each other, and
   wherein the first horizontal driving voltage line and the second horizontal driving voltage line are connected to the connection line through a contact hole.

9. The display device of claim 8, wherein the data line extends in the second direction by extending through a space between the first horizontal driving voltage line and the second horizontal driving voltage line.

10. The display device of claim 8, wherein the first horizontal driving voltage line is connected to a second horizontal driving voltage line of a second pixel neighboring the first pixel.

11. The display device of claim 8, wherein the connection line is arranged below the horizontal driving voltage line with at least one insulating layer disposed between the connection line and the horizontal driving voltage line.

12. The display device of claim 8, wherein the connection line is arranged over a same layer as the driving gate electrode.

13. The display device of claim 1, wherein the driving TFT of the first pixel further comprises a driving semiconductor layer at least partially overlapping the driving gate electrode and having a bent shape, and
wherein a shape of the driving TFT of the first pixel is the same as a shape of a driving TFT of a second pixel that moves in parallel in the first direction, the second pixel neighboring the first pixel.

14. The display device of claim 1, wherein the first pixel comprises an organic light emitting diode (OLED) electrically connected to the driving TFT.

15. The display device of claim 1, wherein the driving gate electrode and the first electrode are integrally formed as a same body.

16. The display device of claim 1, wherein the data line is disposed on a same layer on which the horizontal driving voltage line and the vertical driving voltage line are disposed.

17. A display device comprising a plurality of pixels,
wherein a first pixel of the plurality of pixels comprises:
a scan line extending in a first direction;
a data line extending in a second direction intersecting the first direction;
a switching thin film transistor (TFT) connected to the scan line and the data line;
a driving TFT connected to the switching TFT and comprising a driving gate electrode;
a storage capacitor comprising the driving gate electrode as a first electrode and a second electrode arranged above the first electrode and overlapping the first electrode;
and
a first vertical driving voltage line integrally formed the second electrode and extending in the second direction,
wherein a second pixel adjacent to the first pixel in the first direction comprises a second vertical driving voltage line extending in the second direction;
wherein the first vertical driving voltage line and the second vertical driving voltage line are connected to a connection line through a first contact hole and a second contact hole respectively, the connection line is arranged over a different layer from the first vertical driving voltage line,
wherein the first vertical driving voltage line, the second vertical driving voltage line, and the data line are arranged over a same layer.

18. The display device of claim 17, wherein a length of the connection line extending in the first direction shorter than a length of the scan line extending in the first direction.

19. The display device of claim 17, wherein the connection line is arranged on a same layer as the driving gate electrode.

20. The display device of claim 17, wherein the driving TFT of the first pixel further comprises a driving semiconductor layer at least partially overlapping the driving gate electrode and having a bent shape, and
wherein a shape of the driving TFT of the first pixel is symmetrical with a shape of a driving TFT of the second pixel.

* * * * *